United States Patent Office 3,019,106

Patented Jan. 30, 1962

3,019,106

PROCESSING OF PRE-SENSITISED LITHOGRAPHIC PRINTING PLATES

Ronald Alfred Charles Adams, London, England, assignor to Algraphy Limited, London, England No Drawing. Filed Jan. 10, 1961, Ser. No. 81,699
4 Claims. (Cl. 96—48)

This invention relates to the procesing of pre-sensitised photo-lithographic printing plates and is a continuation-in-part of that described in my copending application Serial No. 823,859, filed June 30, 1959.

The light-sensitive coatings commonly used for photo-lithographic plates (the bichromated colloids) are relatively unstable and plates so coated have to be used within a matter of hours under normal conditions of temperature and humidity. The term "pre-sensitised" is one well understood in the lithographic industry and indicates that the photo-lithographic printing plate has been coated with a stable light-sensitive material so that the plates so coated can, for example, be manufactured in quantity and stored if necessary for long periods under ordinary conditions of temperature and humidity until required for use.

The light-sensitive coating for a pre-sensitised plate may consist for example of a water-soluble material which becomes insoluble in water on exposure to light, or a material which becomes more soluble or less soluble in aqueous solutions of acids or alkalies after exposure to light, or a material which is initially soluble in an organic solvent (but not in water or aqueous solutions) and which becomes insoluble in the organic solvent after exposure to light. (In every case, the change in solubility after exposure to light being the basis of subsequent image development.) This invention is concerned solely with the last mentioned type of light-sensitive coating, i.e. one which is initially soluble in an organic solvent and which becomes less soluble or insoluble in the solvent after exposure to light.

The lithographic plate itself which supports the light-sensitive coating is commonly made of aluminium which may be anodised and which may be grained or smooth, but other materials are also used, for example, zinc, paper and plastics, as well as chemical conversion coatings on metal such as a silicate, chromate or phosphate.

The light-sensitive coatings concerned in this invention which have been put to commercial use include the cinnamic acid esters of poly-alcohols. The poly-alcohol usually employed comprises polyvinyl alcohol, celluose or starch; more recently certain "epoxy resins" (the best known being the reaction products of epichlorhydrin and diphenylolpropane) have been employed making use of their multiplicity of hydroxy groups; in addition in our copending British patent applications Nos. 28,196/58 and 28,197/58 dated September 2, 1958, we disclose certain polyester-alcohols and polyether-alcohols which may also be employed. The coating may also contain minor proportions of light sensitisers and polymerisation inhibitors as well as indicator dyes which change colour on exposure to light. Under the influence of light it may be assumed that cross-linking in the resin molecule is induced which contributes to a reduction in the solubility of the resin. The conventional method of processing coated printing plates of the kind referred to after exposure to light through a design, stencil or negative consists in (1) swabbing with, or immersion in, an organic solvent in which the unexposed regions of the coating dissolve while the exposed areas thereof remain undissolved; (2) drying and treating with a lithographic desensitising solution to render the non-image areas of the plate ink-repellent. Normally, the desensitising solution comprises an aqueous solution containing one or more lithographic desensitising agents such as gum arabic, sodium carboxymethyl cellulose, phosphoric acid and its salts. Finally (3) rubbing the image areas of the plate with ink or a coloured lacquer emulsion (a so-called "developing lacquer") to render them plainly visible, and in some instances to increase the chemical resistance and ink receptivity of the image. Thus, the methods of processing hitherto practiced involve three separate operations (one of which involves tanks, dishes or sprays of solvents) and the tedious nature thereof has imposed severe restrictions on the commercial exploitation of printing plates having a light-sensitive coating of the solvent-development type.

The present invention provides means for overcoming the above-mentioned disadvantages and is based on the discovery that by suitable formulation the solvent, desensitiser, and colourant can be combined in such manner as to form an emulsion whereby an exposed coated plate can be developed, desensitised and coloured in a single operation.

According to the present invention therefore, in the processing of a presensitised photolithographic plate of the kind having a resinous organic solvent-soluble light-sensitive coating which is insoluble in water and aqueous solutions but which is initially soluble in an organic solvent and which becomes insoluble in the organic solvent after exposure to light; the invention consists in the step of treating the plate, after exposure to active light through an image transparency, with an emulsion consisting essentially of a water-insoluble organic solvent for the light-sensitive coating on the non-image areas of the plate, which solvent forms the dispersed phase, an aqueous desensitising solution for rendering said non-image areas ink-repellent and a water-insoluble dye for the image areas, said dye being dissolved in the solvent and stable to the aqueous phase of the emulsion.

For the purposes of the specification and the claims of this invention the expression "organic solvent soluble light-sensitive coating" will be understood to include those coatings in which the unexposed light-sensitive coating is soluble in an organic solvent and in which it becomes insoluble after exposure to active light. It should also be insoluble in water before and after exposure to active light. More specifically before the action of active light it is soluble in the non-aqueous phase of the emulsion and is insoluble in the aqueous phase of the emulsion and becomes insoluble in both phases after the action of active light. The terms "soluble" and "insoluble" may be taken as practical ones, i.e. one should disregard minor solubility effects. The essence of the invention is that the differentiation between image and non-image areas of the lithographic plate after exposure to active light is brought about by the removal of the light-sensitive coating in the non-image areas by solution of the coating in the non-aqueous phase of the emulsion as it breaks at the surface of the coating, leaving behind the light-insolubilised coating in the image areas. The colouring of the image and the desenitisation of the non-image areas of the plate are further simultaneous achievements.

Provided the emulsion possesses the required characteristics, it has been found that upon treating the exposed plate with the emulsion the latter "breaks" on contact with the coating and the unexposed regions of the coating dissolve in the solvent while the exposed region which is permeable to, but insoluble in, the solvent is dyed by means of the dye contained in the solvent, the non-printing regions from which the unexposed coating has been dissolved being lithographically desensitised (rendered ink-repellent) by the aqueous phase.

In carrying the invention into effect there are several important factors that have to be taken into account in preparing the emulsion. Thus the emulsion should be of the oil-in-water type, i.e. the solvent is the dispersed phase.

Moreover, it should not be too stable or too finely dispersed for effective operation, that is to say it should "break" readily at the surface of the light-sensitive coating. The solvent chosen should preferably be of medium volatility (boiling range 100°–200° C.). It should dissolve the unexposed coating readily and it should be completely or almost completely insoluble in water.

The particular solvent chosen will, of course, depend on the light-sensitive coating employed but those acquainted with this art will have no difficulty in choosing a suitable solvent for any particular light-sensitive coating. Thus, for instance, in the case of the cinnamic esters of poly-alcohols, the following may be used: Aromatic hydrocarbons, especially toluene, ethylbenzene and tetralin; halogenated hydrocarbons, for example, chlorobenzene, trichlorethylene and perchlorethylene; ketones, especially methyl ethyl ketone; cyclopentanone and cyclohexanone; esters, especially amyl acetate, cyclohexanol acetate, methoxybutyl acetate and benzyl acetate. Other solvents include epichlorhydrin, nitropropane, benzaldehyde, benzyl alcohol.

Mixture of solvents, the components of which may not individually be suitable, will sometimes form solvent mixtures, for example:

A mixture of 90 parts by volume xylene and 10 parts by volume n-butanol, or equal volumes of acetone and dekalin.

Small quantities of water-miscible or partially miscible solvents may be added to aid emulsification, including, for example, aliphatic alcohols, such as n-butanol, ether alcohols, such as ethoxy-ethanol, and ether-alcohol esters, such as ethoxy-ethyl-acetate.

The colourant employed should be a dye that is readily soluble in the solvent while being insoluble in, and stable to, the aqueous phase of the emulsion.

Obviously, a large range of water-insoluble organic solvent-soluble dyes are available as the dye component of such emulsions. Thus, to mention a few only, the following among many others may be used.

| Proprietary name: | Colour Index No. |
|---|---|
| Waxoline Red O | Solvent Red 24 |
| Lithofor Yellow ADS | Solvent Yellow 30 |
| Waxoline Green GS | Solvent Green 3 |
| Waxoline Blue AS | Solvent Blue 36 |
| Waxoline Mahogany | Solvent Red 2 |
| Waxoline Nigrosin | Solvent Black 7 |

As optional constituents, resins or greasy plasticisers may be added to the emulsion to increase the greasiness of the image provided that they do not materially affect the basic action of the emulsion, i.e. to establish an image by removal of the unhardened light-sensitive resin from the non-image areas of the plate by the disperse organic-solvents phase of the emulsion. The proportions of such resin or plasticiser which can be added will obviously depend on their individual properties such as their solubility in the emulsion solvent, their effect on the viscosity and the stability of the emulsion, etc. A readily soluble low molecular weight resin such as colophony might be used in fairly high proportion (e.g. as much as 25% w./w. in the solvent) whereas a high molecular weight polyvinyl chloride or acetate might be limited to as little as 1% w./w. Similarly, the proportion of plasticiser would in general be limited to not more than 10% w./w. of the solvent to avoid any resultant softening of the image more than counteracting the advantage of increased greasiness. The use of resins and plasticisers in this way must be considered a relatively unimportant variation, of the basic principle of the invention, and indeed is not necessary in putting the invention into effect.

The aqueous phase should possess good lithographic desensitising properties, that is it should include a proportion of those materials known in the art as desensitising agents such as orthophosphoric acid and its salts, e.g. ammonium dihydrogen phosphate, polyphosphate salts, e.g. sodium hexametaphosphate and organic materials, e.g. gum arabic, sodium or ammonium carboxymethylcellulose, sodium or ammonium alginate, oxidised starch, etc. The final emulsion should contain emulsifying agents in sufficient quantity to produce the correct type of dispersion, i.e. with solvent as the dispersed phase, with the stability specified above.

Non-limitative examples of emulsions prepared in accordance with the invention are given below.

In each example it is implicit that the solvent phase is a satisfactory solvent for the particular light-sensitive resin in use. The solvents used in the examples are suitable for processing polyvinyl cinnamate amongst other materials.

(*a*) It appears to be a rule that cinnamates (and related esters) of any polymeric poly-alcohol may be considered as alternatives, e.g. cinnamic esters of starch, cellulose, hydroxycellulose, poly-epoxy resins, poly-alcohols derived from poly-epoxy resins, etc.

(*b*) A number of other classes of light-sensitive materials which have in common (1) relatively high molecular weights i.e. they are polymeric and (2) a centre of unsaturation from which the light-sensitivity and cross-linking ability is derived. For instance those described in the following patents:

British Patent 822,861 (B-aryl acrylic derivatives)
British Patent 820,173 (chalkone derivatives)
British Patent 825,948 (linear polymers)
U.S. Patent 2,566,302 (co-polymers)

*Example I*

| | Parts by weight |
|---|---|
| Solvent phase: | |
| Xylol | 25 |
| Butyl alcohol | 4.7 |
| Waxoline Red (a neutral oil-soluble red dye) | 0.3 |
| Aqueous phase: | |
| Gum arabic solution (s.g. 1.10) | 69 |
| Phosphoric acid (s.g. 1.75) | 0.3 |
| Perminal BX (20% w/v) (an anionic wetting agent) | 0.7 |

The aqueous phase in this example provides satisfactory lithographic desensitisation of an aluminium plate. The emulsion is formed by vigorously stirring the constituents of the aqueous phase whilst slowly adding thereto the constituents of the solvent phase.

*Example II*

| | Parts by weight |
|---|---|
| Solvent phase: | |
| Amyl acetate | 25 |
| Tetrachlorethylene | 25 |
| Oil soluble blue dye | 0.5 |
| Aqueous phase: | |
| Sodium carboxymethyl cellulose | 2.5 |
| Ammonium dihydrogen | 2.5 |
| Phosphate magnesium nitrate | 2.5 |
| Aerosol OT (20%) | 0.5 |
| Water to make up to 50. | |

The emulsion is prepared as in Example I. The aqueous phase in this example provides satisfactory lithographic desensitisation of a zinc plate.

*Example III*

| | Gms., mixed |
|---|---|
| Solvent phase: | |
| Waxoline Red OS | 0.3 |
| Methoxybutyl acetate | 26.5 |
| Ethylene glycol monoethyl ether acetate | 5.5 |
| Powdered rosin (colophony) | 10.0 |
| Aqueous phase: | |
| Gum arabic solution (s.g. 1.10) | 88.0 |
| Ammonium dihydrogen phosphate | 2.0 |
| Phosphoric Acid (s.g. 1.75) | .15 |
| Perminal BX | .15 |

The emulsion is prepared as in Example I.

*Example IV*

The emulsion in this Example was prepared as described in Example I with the same ingredients as in Example III except that 3 gms. of tricresyl phosphate (plasticiser) were substituted for the 10 gms. of colophony.

I claim:

1. In the processing of a presensitized photo-lithographic plate of the kind having a resinous, organic solvent soluble light-sensitive coating which is insoluble in water and aqueous solutions but which is initially soluble in an organic solvent and which becomes insoluble in the organic solvent after exposure to light; the step which consists in treating the plate after exposure to active light through an image transparency, with an emulsion consisting essentially of a water-insoluble organic solvent for the light sensitive coating on the non-image areas of the plate, which solvent forms the dispersed phase, an aqueous desensitizing solution rendering said non-image areas ink-repellant and a water-insoluble dye for the image areas, said dye being dissolved in the solvent and stable to the aqueous phase of the emulsion.

2. A process as claimed in claim 1, wherein the solvent employed has a boiling point within the range 100°–200° C.

3. In the processing of a presensitized photo-lithographic plate of the kind having a re... ous, light-sensitive coating which is insoluble in water and aqueous solutions but which is initially soluble in an organic solvent and which becomes insoluble in the organic solvent after exposure to light; the step which consists in treating the plate after exposure to active light through an image transparency, with an emulsion consisting essentially of a water-insoluble organic solvent for the light sensitive coating on the non-image areas of the plate, which solvent forms the dispersed phase, an aqueous desensitizing solution rendering said non-image areas ink-repellant and a water-insoluble dye for the image areas, said dye being dissolved in the solvent and stable to the aqueous phase of the emulsion, said dye being the sole non-volatile component of the organic solvent phase of the emulsion.

4. A process as claimed in claim 3, wherein the solvent employed has a boiling point within the range 100°–200° C.

No references cited.